(12) United States Patent
Wise et al.

(10) Patent No.: US 7,688,116 B1
(45) Date of Patent: Mar. 30, 2010

(54) READ DATA PATH

(75) Inventors: Philip Wise, High Wycombe (GB); Philip Clarke, Leatherhead (GB)

(73) Assignee: Altera Corporation, San Jose, CA (US)

( * ) Notice: Subject to any disclaimer, the term of this patent is extended or adjusted under 35 U.S.C. 154(b) by 43 days.

(21) Appl. No.: 12/151,868

(22) Filed: May 9, 2008

(51) Int. Cl.
*H03K 19/00* (2006.01)
*H03L 7/00* (2006.01)
*H04L 7/00* (2006.01)

(52) U.S. Cl. .......................... 326/93; 327/141; 375/355
(58) Field of Classification Search ................... 326/38, 326/93; 327/141, 415, 166; 375/362, 355
See application file for complete search history.

(56) References Cited

U.S. PATENT DOCUMENTS 7,190,754 B1 *  3/2007  Chang et al. ................. 375/373
2006/0188043 A1 * 8/2006  Zerbe et al. .................. 375/346

OTHER PUBLICATIONS

Constraining and Analyzing Timing for External Memory Interfaces in Stratix III and Cyclone III Devices, Altera Corporation, Oct. 2007, pp. 1-24.

External DDR Memory PHY Interface Megafunction User Guide (ALTMEMPHY), Altera Corporation, Dec. 2007, pp. iii-vi, 1-3, Fig. 1-1, 3-1 to 3-9, 3-20 to 3-26, 3-29 to 3-33, 3-36 to 3-37.

* cited by examiner

*Primary Examiner*—Daniel D Chang
(74) *Attorney, Agent, or Firm*—Mauriel Kapouytian & Treffert LLP; Michael Mauriel (57) ABSTRACT

Circuitry and methods are disclosed for capturing data from a double-data rate signal received from a source circuit, converting the double-data rate signal to single and/or half rate data signals, and re-synchronizing the data to the destination circuit's clock signal. In one embodiment, a first set of registers converts a double-data rate signal synchronized to a full-rate clock signal to two single-data rate signals. A second set of registers converts the single-data rate signals to four half-data rate signals. A third set of registers synchronizes the half-rate data signals to a half-rate clock signal. In another embodiment, methods and circuitry are provided for determining the position of a data valid window of the half-data rate intermediate signals relative to the rising and falling edges of the half-rate clock signal and using that determination to select half-data rate intermediate signals captured on either a rising or falling edge of the half-rate clock signal, depending on which will provide greater accuracy.

26 Claims, 9 Drawing Sheets

READ DATA PATH

BACKGROUND

The invention relates to the field of digital circuit timing and clocking.

When digital signals cross clock domain boundaries they have to be captured and synchronized to match the clocking requirements of the destination circuit. Double-data rate devices are able to transfer data at a rate corresponding to twice their specified clock rate by clocking data on both the rising and falling edges of their clock signal. Many electronic devices interfacing with double-data rate devices, however, include at least a portion adapted to process single- or half-data rate signals. In these devices, data moves at half or a quarter of the rate, respectively, of a double-data rate device. In some instances, moreover, a clock signal used by the double data rate device might have a faster frequency than (e.g. double) that of a destination clock signal used by portions of the destination device that is interfacing with the double data rate device. In any event, the data signals from the double-data rate device must be captured by the destination device and synchronized with a destination clock signal used by at least portions of the destination device.

One known read data path circuit for interfacing with double-data rate devices uses a First In, First Out ("FIFO") buffer for capturing, transferring, and synchronizing data. In a first step, it divides a double-data rate data stream into two parallel single-data rate streams, one containing data derived from the rising edges and another containing data derived from the falling edges of the source circuit clock signal, respectively. In a second step, the two streams are written in parallel to a FIFO on two inputs. In a third step, data written to the FIFO is read out at half-data rate on four outputs. Thus, the FIFO-based approach accomplishes the re-timing of the transferred data by writing data into the FIFO at single-data rate on two ports and reading data out of the FIFO at half-data rate on four ports.

Although the FIFO-based approach is accurate, the FIFO circuit is expensive in terms of latency. Specifically, the transfer of data from the FIFO input to its output may introduce 5-6 clock cycles of delay. The device will often have to stop processing to wait for the read data to return, therefore the performance of the system can be adversely affected by an increase in memory read latency.

SUMMARY

One embodiment of the present invention provides a read data path circuit that captures a double-data rate signal synchronized to a capture clock signal and outputs half-data rate signals synchronized to a destination clock signal. In more particular aspects, the exemplary embodiment comprises a capture circuit that receives the double-data rate signal and generates single-data rate signals synchronized to the capture clock signal, a de-multiplexing circuit that receives the single-data rate input signals from the capture stage and generates half-data rate intermediate signals, and a synchronization circuit that receives the half-data rate intermediate signals and generates half-data rate output signals synchronized to the destination clock signal. In another embodiment, there is also provided circuitry and methods for determining the position of a data valid window of the half-data rate intermediate signals relative to rising and falling edges of the destination clock signal and using that determination to select half-data rate intermediate signals captured on either a rising or falling edge of the destination clock signal, depending on which selection will provide for greater accuracy.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

For the particular examples described herein, a destination circuit's clock signal has a frequency substantially equal to half the frequency of the source circuit's clock signal. Therefore, for convenience of describing the illustrated examples, the source circuit's clock signal is sometimes referred to as a full-rate clock signal and the destination circuit's clock signal is sometimes referred to as a half-rate clock signal. Thus the "capture clock signal" referenced herein is, for purposes of the illustrated examples, a full-rate clock signal used to capture data provided by the source circuit. These and other various labels are used herein to facilitate clear description of the examples illustrated herein and should not be viewed as having a restrictive meaning beyond that purpose.

A double-data rate signal contains a single beat of data on each of the rising and falling edges of a full-rate clock. A single-data rate signal carries a beat of data on only one edge of the full-rate clock. A half-data rate signal carries data on only one edge of a half-rate clock signal. Because the half-data rate signal carries data on only one edge of the half-rate clock, it follows that a half-data rate signal carries a quarter of the amount of information that is carried in an equivalent time interval by the double-data rate signal.

Figure 1:
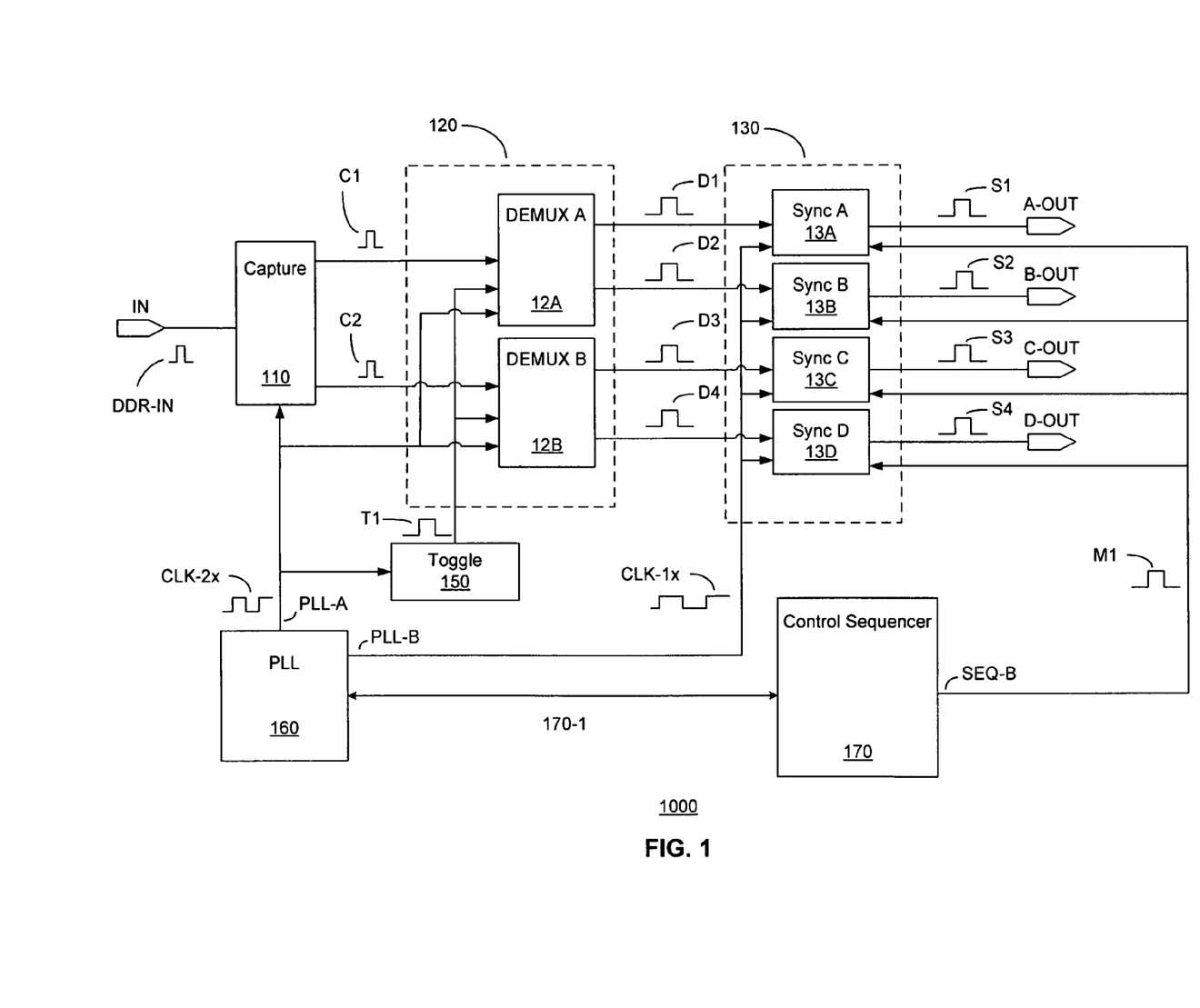
FIG. 1 is a block diagram of a read data path circuit in accordance with an embodiment of the present invention.

FIG. 1 illustrates an exemplary system block diagram of a read data path circuit 1000 in accordance with an embodiment of the invention.

Read data path circuit 1000 includes a capture circuit 110, a de-multiplexer circuit 120, and a synchronization circuit 130. De-multiplexer circuit 120 includes de-multiplexing modules, 12A and 12B. Synchronization circuit 130 includes synchronization modules 13A, 13B, 13C and 13D. Read data path circuit 1000 further includes a phase locked loop ("PLL") 160, a control sequencer 170, and a toggle 150.

As shown, read data path circuit 1000 receives a double-data rate signal DDR-IN on input IN and generates half-data rate output signals S1, S2, S3, and S4 on outputs A-OUT, B-OUT, C-OUT, and D-OUT, respectively. Input IN is coupled to capture circuit 110. Capture circuit 110 is, in turn, coupled to the two de-multiplexing modules, 12A and 12B. Each de-multiplexing module is, in turn, coupled to two synchronization modules. De-multiplexing module 12A is coupled to the two synchronization modules 13A and 13B. De-multiplexing module 12B is coupled to the two synchronization modules 13C and 13D. The outputs of synchronization modules 13A, 13B, 13C and 13D are coupled to outputs A-OUT, B-OUT, C-OUT, and D-OUT, respectively.

Read data path circuit 1000 receives clock signals from PLL 160 and control signals from control sequencer 170. As shown, PLL 160 is coupled on output PLL-A to capture circuit 110, the two de-multiplexing modules 12A and 12B, and toggle 150. PLL 160 is coupled on output PLL-B to the four synchronization modules 13A, 13B, 13C, and 13D. Control sequencer 170 is coupled on output SEQ-B to the four synchronization modules 13A, 13B, 13C and 13D. Control sequencer 170 and PLL 160 are coupled on signal bus 170-1. Those skilled in the art will appreciate that, in alternative embodiments, the necessary clock signals may be provided from circuits other than a PLL circuit. To cite but one example, a circuit that can generate multiple clock signals such as a Delay Locked Loop ("DLL") maybe be used.

Two clock signals are involved in timing the operation of read data path circuit 1000. Clock signal CLK-2x ("capture clock signal") is a full-rate clock signal. As shown, it is generated on output PLL-A of PLL 160 and is coupled to be received by capture circuit 110 and de-multiplexing circuit 120. Clock signal CLK-1x ("destination circuit clock signal") is a half-rate clock signal. As shown, it is generated on output PLL-B of PLL 160 and is coupled to be received by synchronization circuit 130. Although both capture clock signal CLK-2x and destination circuit clock signal CLK-1x are tracked by PLL 160, CLK-2x does not maintain any fixed phase difference to CLK-1x. CLK-2x is synchronized to the source circuits' clock and CLK-1x is synchronized to the destination circuits' clock. Control sequencer 170 forwards phase and frequency information of clock signal CLK-2x to PLL 160 over signal bus 170-1.

As shown, within de-multiplexer circuit 120, clock signal CLK-2x is used to time the operation of de-multiplexing modules 12A and 12B. Within synchronization circuit 130, clock signal CLK-1x is used to time the operation of synchronization modules 13A, 13B, 13C and 13D. Toggle 150 uses clock signal CLK-2x to generate toggle signal T1. Toggle signal T1 is used to control the operation of both de-multiplexing modules 12A and 12B.

Capture circuit 110, clocked by capture clock signal CLK-2x, receives double-data rate input signal DDR-IN and uses it to generate single-data rate signals C1 and C2. De-multiplexer module 12A, also clocked by capture clock signal CLK-2x, receives signal C1 and generates two half-data rate intermediate signals D1 and D2. D1 is routed to synchronization module 13A and D2 is routed to synchronization module 13B. De-multiplexer module 12B, also clocked by source circuit clock signal CLK-2x, receives signal C2 and generates two half-data rate intermediate signals D3 and D4. D3 is routed to synchronization module 13C and D4 is routed to synchronization module 13D.

Synchronization modules 13A, 13B, 13C and 13D, receive half-data rate intermediate signals D1, D2, D3, and D4, respectively, and generate half-data rate output signals S1, S2, S3, and S4, respectively. Each module also receives multiplexer control signal M1 from control sequencer 170.

Figure 2:
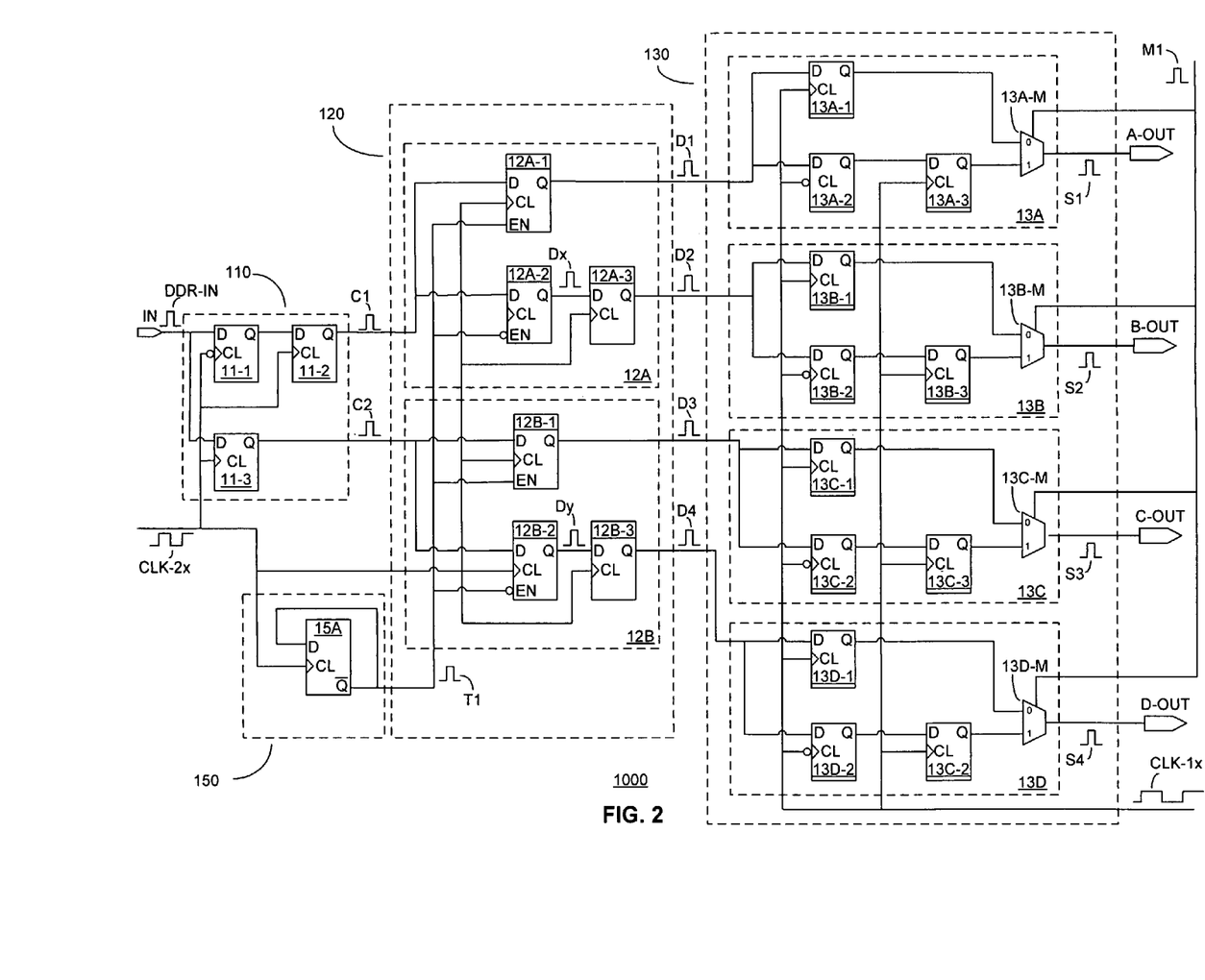
FIG. 2 illustrates further details of the read data path circuit of FIG. 1.

FIG. 2 illustrates further details of exemplary read data path circuit 1000 in accordance with an embodiment of the invention.

As shown, capture circuit 110 includes negative edge triggered flip-flop 11-1, positive edge triggered flip-flop 11-2, and positive edge triggered flip-flop 11-3. Flip-flop 11-1 receives double-data rate input signal DDR-IN on data input "D" and clock signal CLK-2x on clock input "CL." Its data output "Q" is coupled to data input "D" of flip-flop 11-2. Flip-flop 11-2 receives the output of flip-flop 11-1 on its data input "D" and clock signal CLK-2x on its clock input "CL." Flip-flop 11-3 receives double-data rate input signal DDR-IN on its data input "D" and clock signal CLK-2x on its clock input "CL." Single-data rate signals C1 and C2 are generated on data outputs "Q" of flip-flops 11-2 and 11-3, respectively.

Toggle 150 includes a single positive-edge triggered flip-flop 15A with its complement data output "$\overline{Q}$" fed back to its data input "D." Depending on the initial state of output "$\overline{Q}$," toggle signal T1 will start out at a logical HIGH or LOW value and will thereafter transition on every rising edge of clock signal CLK-2x. The initial state of toggle signal T1 can be measured and set by various basic logic circuit techniques and will not be explained further herein.

As shown, de-multiplexing module 12A includes positive edge triggered flip-flop 12A-1, a positive edge triggered flip-flop 12A-2 and positive edge triggered flip-flop 12A-3. Flip-flop 12A-1 receives single-data rate signal C1 on its data input "D," and uses it to generate half-data rate intermediate signal D1 on its data output "Q." Flip-flop 12A-2 also receives single-data rate signal C1 on its data input "D" and uses it to generate half-data rate signal Dx on its data output "Q." Flip-flop 12A-3 is coupled to receive Dx on its data input "D" and generates half-data rate intermediate signal D2 on its data output "Q." All three flip-flops are clocked by clock signal CLK-2x on their clock inputs "CL." Toggle signal T1 is used to drive enable input "EN" of flip-flop 12A-1 as well as the inverted enable input "EN" of flip-flop 12A-2.

Analogously, de-multiplexing module 12B includes positive edge triggered flip-flop 12B-1, positive edge triggered flip-flop 12B-2 and positive edge triggered flip-flop 12B-3. Flip-flop 12B-1 receives single-data rate signal C2 on its data input "D," and uses it to generate half-data rate intermediate signal D3 on its data output "Q." Flip-flop 12B-2 also receives single-data rate signal C2 on its data input "D" and uses it to generate half-data rate signal Dy on its data output "Q." Flip-flop 12B-3 is coupled to receive Dy on its data input "D" and generates half-data rate intermediate signal D4 on its data output "Q." All three flip-flops are clocked by clock signal CLK-2x on their clock inputs "CL." Toggle signal T1 is used to drive enable input "EN" of flip-flop 12B-1 as well as the inverted enable input "EN" of flip-flop 12B-2.

Certain principles of de-multiplexing modules 12As' operation can be inferred from its circuitry. Toggle signal T1 imposes a condition on the operation of flip-flops 12A-1 and 12A-2 by alternately enabling and disabling them. Since T1 changes state only on every rising edge of full-rate clock signal CLK-2$x$, it functions as a clock at half the frequency of CLK-2$x$. CLK-2$x$ is, therefore, only capable of triggering the flip-flops in one of every two periods of clock signal CLK-2$x$. During the period when a flip-flop is disabled, it retains at its data output "Q" the last value it read on its data input "D." In this way, de-multiplexing modules 12A and 12B serve as frequency dividers. Single-data rate signal C1 is used by flip-flop 12A-1 to generate half-data rate signal D1 and is used by flip-flop 12A-2 and 12A-3 to generate half-data rate signal D2. Similarly, single-data rate signal C2 is used by flip-flop 12B-1 to generate half-data rate signal D3 and is used by flip-flop 12B-2 and 12B-3 to generate half-data rate signal D4.

As shown, synchronization circuit 130 includes synchronization modules 13A, 13B, 13C, and 13D. Each module includes a multiplexer ("mux") with a "0" input and a "1" input. Each mux is coupled to receive signal M1 (originating, as illustrated in FIG. 1, from control sequencer 170). The "0" input of each mux is coupled to a positive edge-triggered flip-flop and the "1" input is coupled to a series combination of a first negative edge triggered flip-flop and a second positive edge triggered flip-flop, in that order. Synchronization module 13A, for example, includes mux 13A-M coupled on its "0" input to data output "Q" of positive edge-triggered flip-flop 13A-1 and coupled on its "1" input to the data output "Q" of positive edge triggered flip-flop 13A-2 which is coupled on its data input "D" to the data output "Q" of negative edge triggered flip-flop 13A-2. The other synchronization modules have analogous design. The outputs of muxes 13A-M, 13B-M, 13C-M, and 13D-M form outputs A-OUT, B-OUT, C-OUT and D-OUT, respectively.

Certain principles of synchronization module 13As' operation can be inferred from its circuitry. Flip-flop 13A-1 forwards signal D1 on a rising edge of clock signal CLK-1$x$ to input "0" of mux 13A-M. If mux 13A-M is set by control sequencer 170 to select the "0" input, output signal S1 transitions to the same state as data output "Q" of flip-flop 13A-1. Flip-flop 13A-2 forwards signal D1 to flip-flop 13A-3 on a falling edge of clock signal CLK-1$x$. Flip-flop 13A-3 forwards the signal to input "1" of mux 13A-M on the next rising edge of clock signal CLK-1$x$. If mux 13A-M is set by control sequencer 170 to select the "1" input, output signal S1 transitions to the same state as data output "Q" of flip-flop 13A-3. In other words, each synchronization module effectively decides whether to forward data from half-data rate intermediate signals D1, D2, D3, and D4 on a rising or falling edge of half-rate clock signal CLK-1$x$.

FIGS. 3, 4, 5, 6, and 7 illustrate the operation of read data path circuit 1000 with the help of timing diagrams. An exemplary double-data rate input signal DDR-IN is used to illustrate signal propagation through read data path circuit 1000 of FIGS. 1 and 2. Signals with the same labels as in FIGS. 1 and 2 are intended to indicate the same signal. For purposes of illustration, a time scale is provided at the top of FIG. 3 and is reproduced in FIGS. 4, 5, 6, and 7. Intervals labeled with the same reference label in the different timing diagrams are intended to refer to the same interval.

Figure 3:
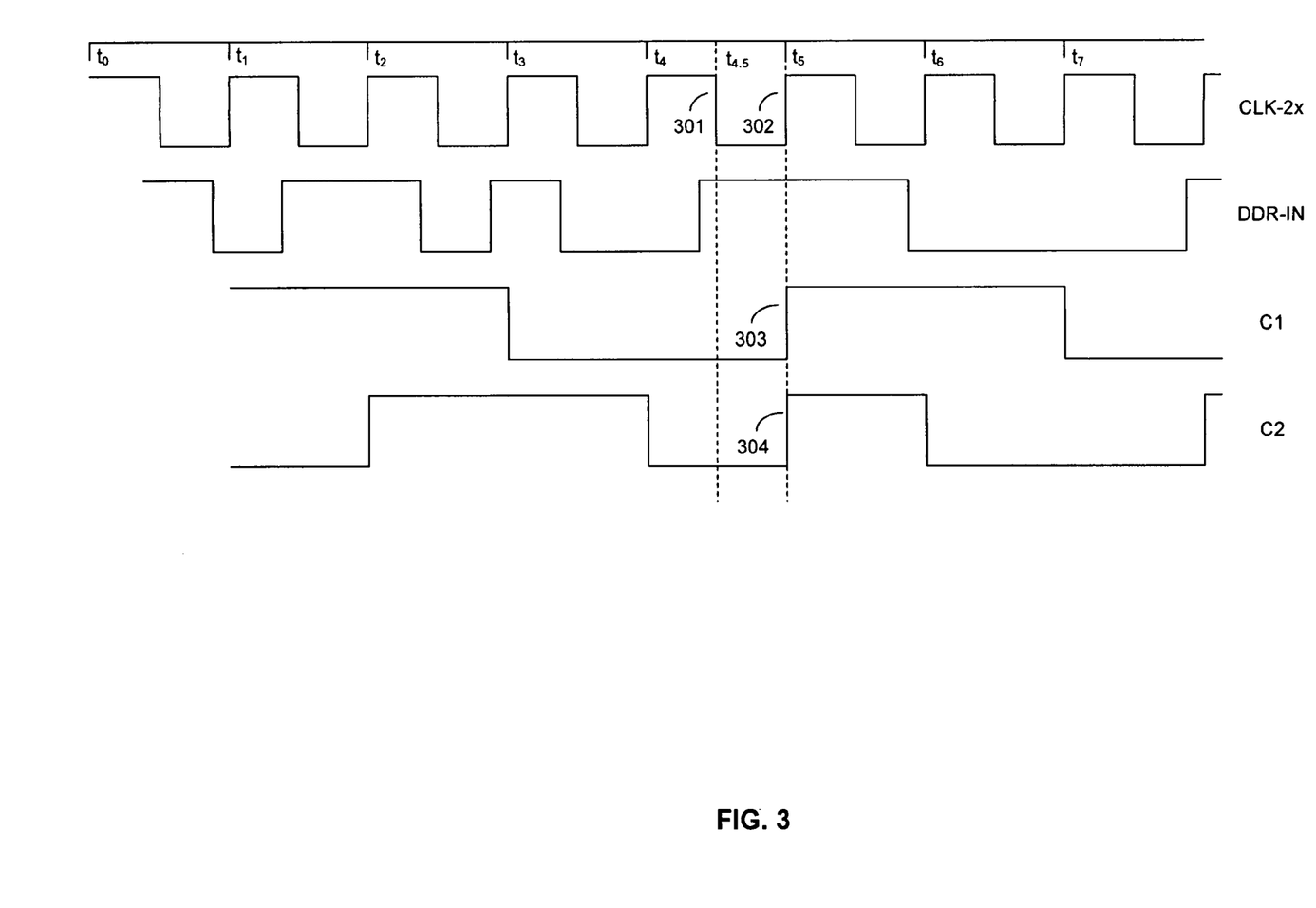
FIG. 3 is a timing diagram illustrating signals associated with the capture circuit shown in FIG. 1.

FIG. 3 illustrates the input and output signals of capture circuit 110. Input signal DDR-IN is an exemplary double-data rate data signal and carries data on both the rising and falling edges of clock signal CLK-2$x$. Thus, for example, at both instances $t_{4.5}$ and $t_5$, corresponding, respectively, to a falling edge 301 and a rising edge 302 of clock signal CLK-2$x$, DDR-IN provides the same data value. Data captured on falling edge 301 at $t_{4.5}$ shows up on signal C1 at transition 303 at $t_5$. Data captured on rising edge 302 shows up on signal C2 at transition 304, also at $t_5$. Together, single-data rate signals C1 and C2 account for all the data carried on double-data rate signal DDR-IN. C1 contains data captured on the falling edges of CLK-2$x$ and C2 contains data captured on the rising edges of CLK-2$x$.

Rising edge 302 and transition 304 occur with negligible delay between them. However, there is a 0.5 t interval delay between when falling edge 301 occurs at $t_{4.5}$ and when C1 transitions at $t_5$. This delay can be explained by reference to the logic gate elements of capture circuit 110. The output of negative edge triggered flip-flop 11-1 is delayed by half a clock cycle (of clock signal CLK-2$x$) by positive edge triggered flip-flop 11-2. The 0.5 t delay is purposely introduced to align data captured on the falling edges to data captured on the rising edges of clock signal CLK-2$x$.

Figure 4:
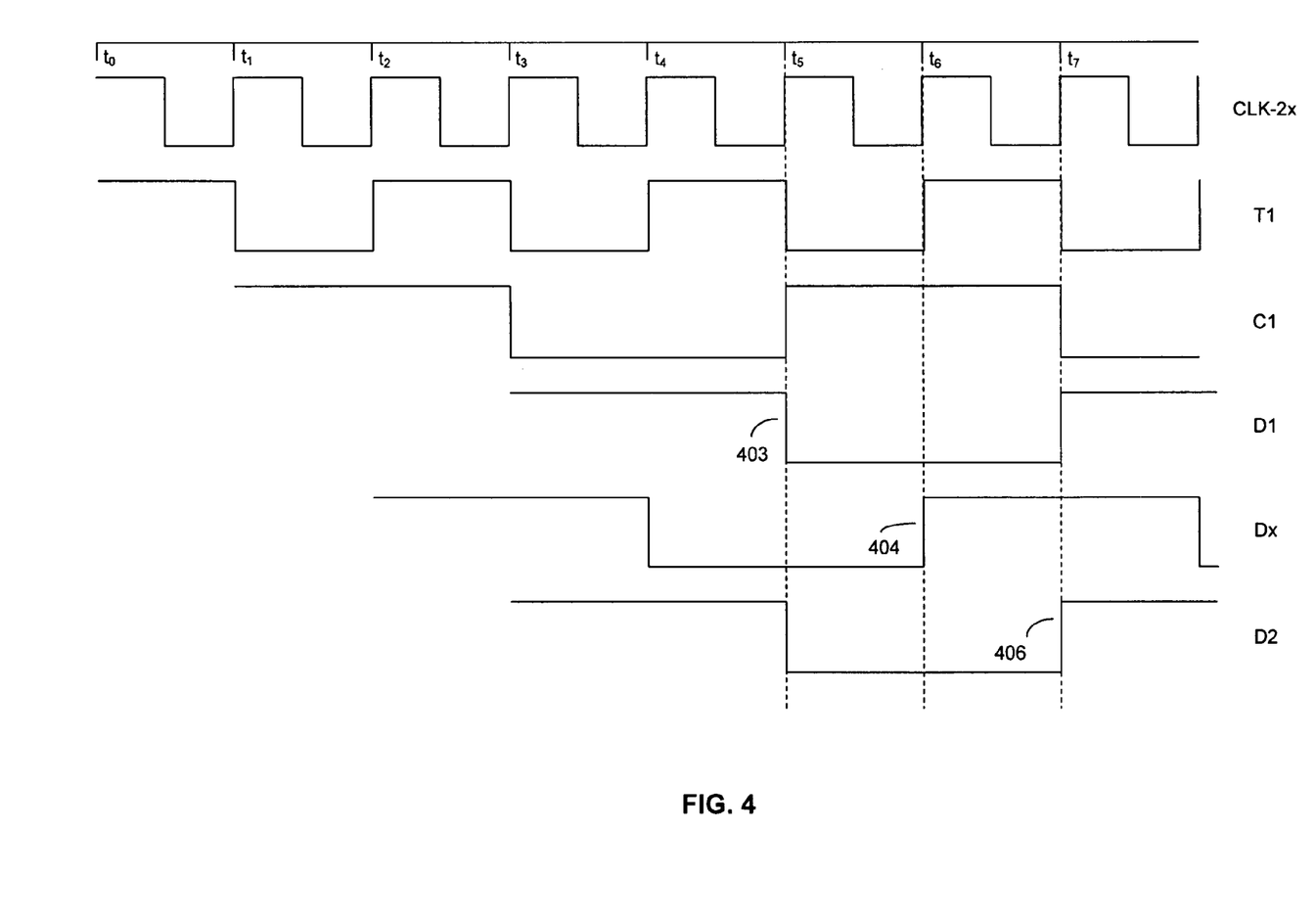
FIG. 4 is a timing diagram illustrating signals associated with a first de-multiplexer module shown in FIG. 1.

FIG. 4 is a timing diagram for de-multiplexing module 12A illustrating all its input and output signals. Clock signal CLK-2$x$ and single-data rate signal C1 are reproduced from FIG. 3.

As explained in the description for FIG. 2, toggle signal T1 at the enable inputs "EN" of flip-flops 12A-1 and flip-flop 12A-2 imposes a condition on their operation. In order for clock signal CLK-2$x$ to trigger them, the enable input "EN" must be HIGH before the arrival of the triggering clock edge. Specifically, the toggle signal will be required to be stable HIGH (or stable LOW for inverted enable input of flip-flop 12A-2) for one interval t. In the same manner, a signal on a data input "D" of any flip-flop will be required to be stable HIGH or stable LOW for at least one interval t before the arrival of a clock edge in order for it to be read correctly.

For example, signal D1, the signal generated by data output "Q" of positive edge triggered flip-flop 12A-1, transitions only when a rising clock edge is present at its clock input "CL" and, in addition, toggle signal T1 was stable HIGH in the previous interval. As illustrated in FIG. 4, $t_5$ represents one such instance; signal D1 therefore transitions in response to the presence of data on signal C1. If signal C1 is not stable and is itself transitioning, as also happens to be the case at $t_5$, D1 transitions to the prior stable value of C1. Therefore, transition 403 of signal D1 from HIGH to LOW reflects the stable LOW value of signal C1 just prior to $t_5$.

Signal Dx, the output at data output "Q" of positive edge triggered flip-flop 12A-2, transitions only when a rising clock edge is present and toggle signal T1 was stable LOW in the previous interval. As illustrated in FIG. 4, $t_6$ represents one such instant; signal Dx changes its state at transition 404 to reflect the stable HIGH signal C1 at this time. Signal D2, the output at data output "Q" of positive edge triggered flip-flop 12A-3, changes state at transition 406 on the next rising edge of CLK-2$x$ which occurs at $t_7$, to reflect the value of signal Dx.

Figure 5:
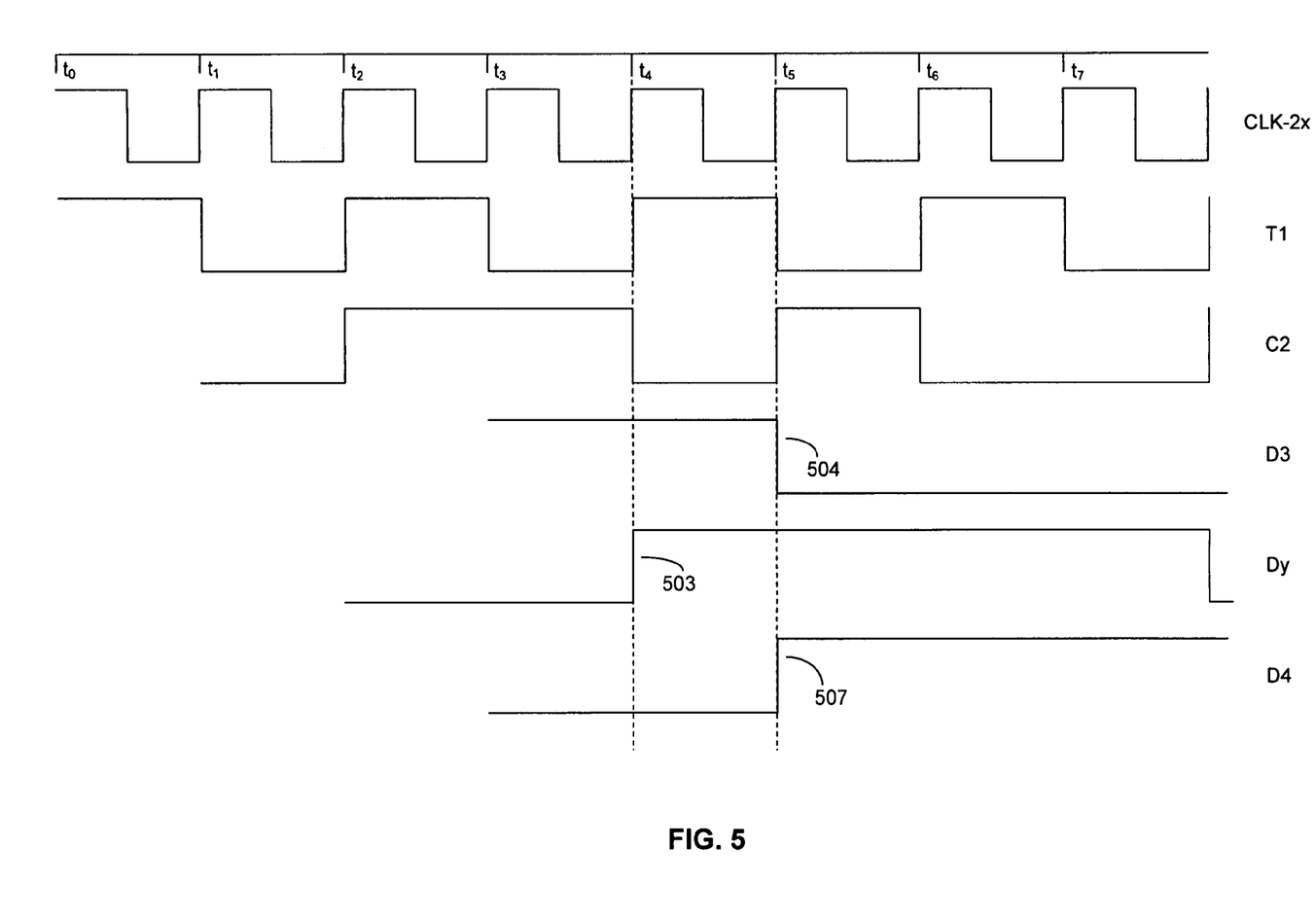
FIG. 5 is a timing diagram illustrating signals associated with a second de-multiplexer module shown in FIG. 1.

FIG. 5 is a timing diagram for de-multiplexing module 12B. Clock signal CLK-2$x$, toggle signal T1, and single-data rate signal C2 are all inputs to module 12B. CLK-2$x$ and C2 are reproduced from FIG. 3 and T1 is reproduced from FIG. 4.

A similar analysis to the one above for module 12A can be applied to FIG. 5 to understand the operation of module 12B. Signal D3, the output signal at data output "Q" of positive edge triggered flip flop 12B-1, transitions only when a rising clock edge is present at its clock input "CL," and toggle signal T1 was stable HIGH in the preceding interval. As shown, $t_5$ represents one such instant; signal D3, therefore, transitions to the value of signal C2 at this time. If signal C2 is not stable and is itself transitioning, as also happens to be the case at $t_5$, it is the prior stable value of C2 that is forwarded. Therefore, signal D3 transitions from HIGH to LOW at transition 504 to reflect the stable LOW value of C2 just prior to $t_5$.

Signal Dy, the output at data output "Q" of positive edge triggered flip-flop 12B-2, transitions only when a rising clock edge is present and toggle signal T1 was stable LOW in the previous interval. As shown, $t_4$ represents one such instant. Signal Dy changes its state at transition 503 to reflect the stable HIGH value of signal C2 just prior to $t_4$. Signal D4, the output at data output "Q" of positive edge triggered flip-flop 12B-3, changes state at transition 507 on the next rising edge of CLK-2x, which occurs at $t_5$, to reflect the stable HIGH value of signal Dy.

Figure 6:
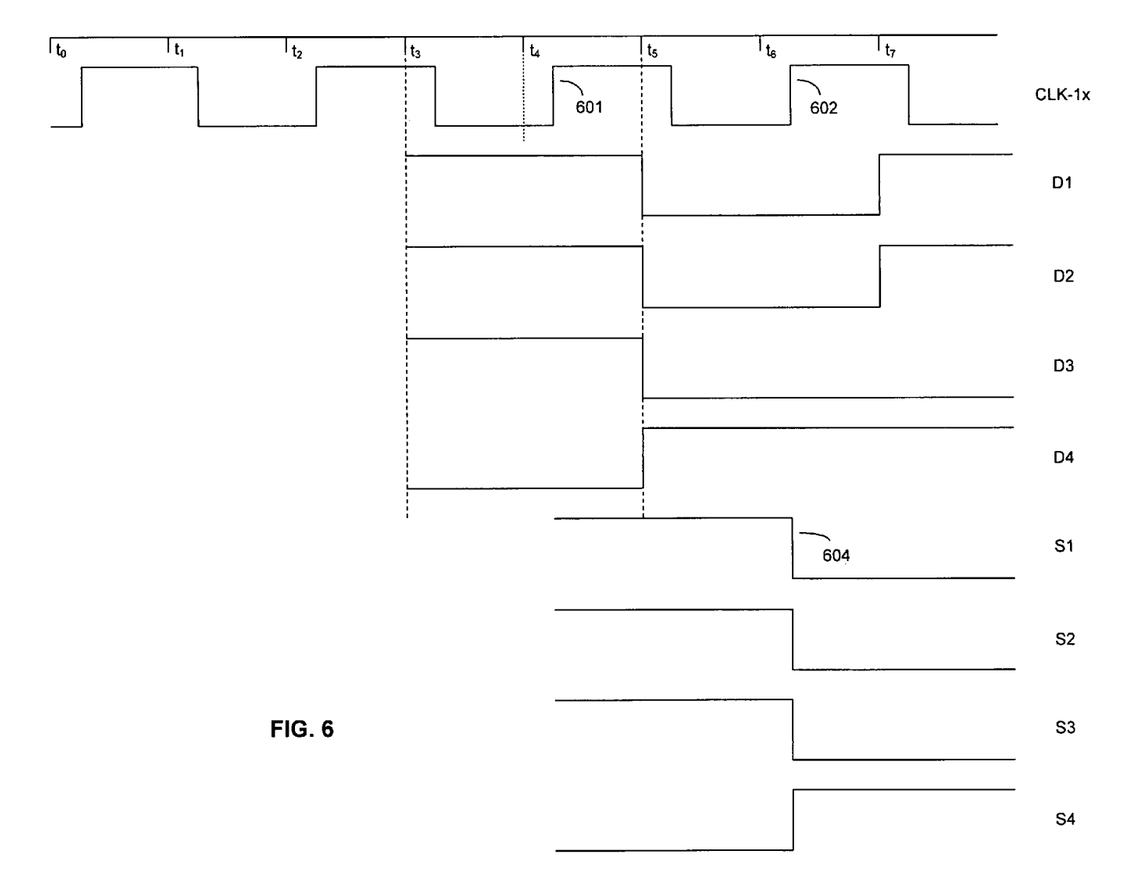
FIG. 6 is a timing diagram illustrating signals associated with a synchronization circuit shown in FIG. 2 for the case when each multiplexer is set to select its "0" input.
Figure 7:
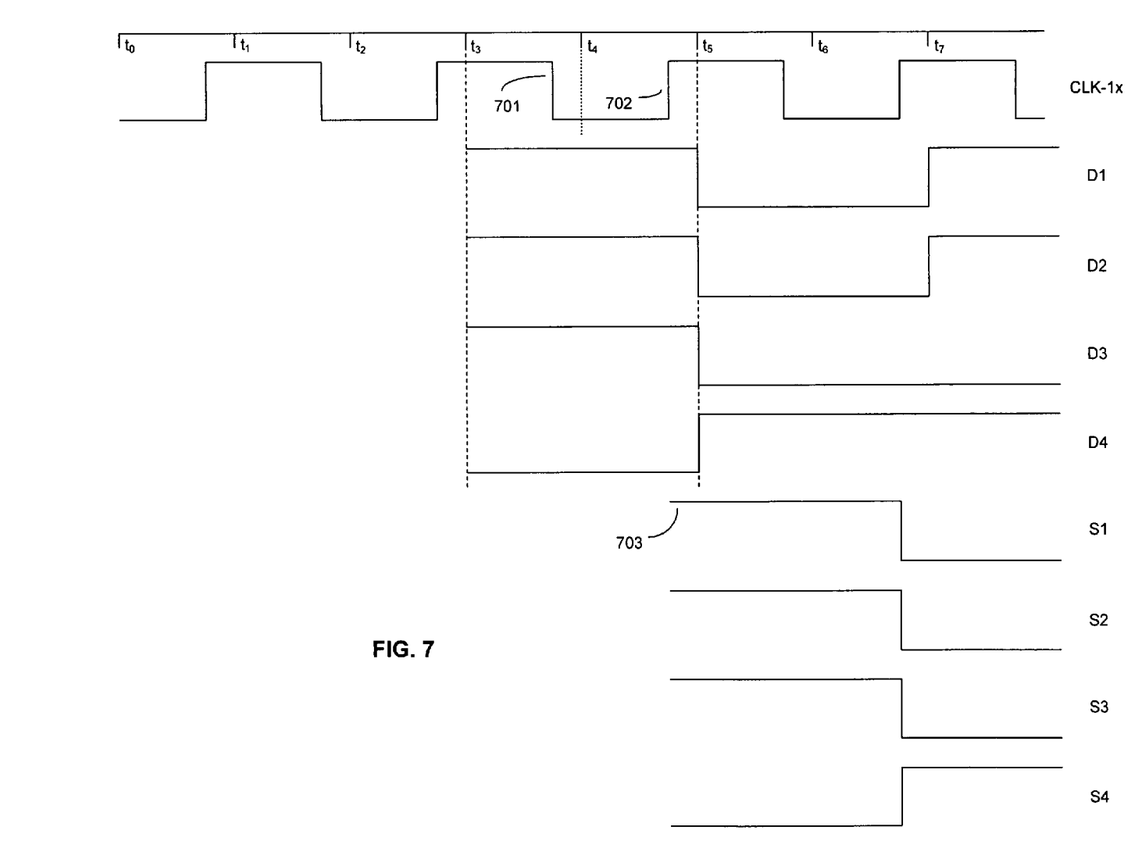
FIG. 7 is a timing diagram illustrating signals associated with synchronization circuit shown in FIG. 2 for the case when each multiplexer is set to select its "1" input.

FIGS. 6 and 7 are timing diagrams for synchronization circuit 130 under two alternate scenarios. In both figures, half-data rate signals D1, D2, D3, and D4 from de-multiplexing stages 12A and 12B are inputs to synchronization modules 13A, 13B, 13C, and 13D, respectively. Half-data rate signals S1, S2, S3, and S4 are their respective outputs. The clock signal in these figures is CLK-1x, the half-rate destination circuit clock signal.

FIG. 6 illustrates a timing diagram for the scenario where muxes 13A-M, 13B-M, 13C-M, and 13D-M in FIG. 2, have all been set by control sequencer 170 to select their "0" inputs. Therefore, of the two inputs to each mux, only the ones coupled to the data output "Q" of positive edge triggered flip-flops 13A-1, 13B-1, 13C-1, and 13D-1 will be selected.

Rising edges of clock signal CLK-1x are used to capture data from signals D1, D2, D3, and D4. As shown, the first rising edge of clock signal CLK-1x to overlap with valid data on signals D1, D2, D3 and D4 is clock edge 601. Positive edge triggered flip-flops 13A-1, 13B-1, 13C-1 and 13D-1 are all triggered by clock edge 601 to generate output signals S1, S2, S2, S3, and S4.

FIG. 7 illustrates a timing diagram for the scenario where muxes 13A-M, 13B-M, 13C-M, and 13D-M in FIG. 2, have all been set by control sequencer 170 to select their "1" inputs. Therefore, of the two inputs to each mux, only the ones coupled to the data output, "Q" of positive edge triggered flip-flops 13A-3, 13B-3, 13C-3, and 13D-3 will be selected.

In the scenario of FIG. 7, falling edges of clock signal CLK-1x are used to capture data from signals D1, D2, D3, and D4. The captured data, however, does not immediately show up as a corresponding transition on output signals S1, S2, S3, and S4. As shown in FIG. 2, it is coupled to be received by positive edge triggered flip flops 13A-3, 13B-3, 13C-3 and 13D-3 which are triggered on a rising edge of clock signal CLK-1x immediately consecutive to the falling edge which triggered flip-flops 13A-2, 13B-2, 13C-2, and 13D-2. Data captured on falling edge 701, for example, is delayed by half a clock cycle (of clock signal CLK-1x) to show up on output signal S1 at 703.

Figure 8:
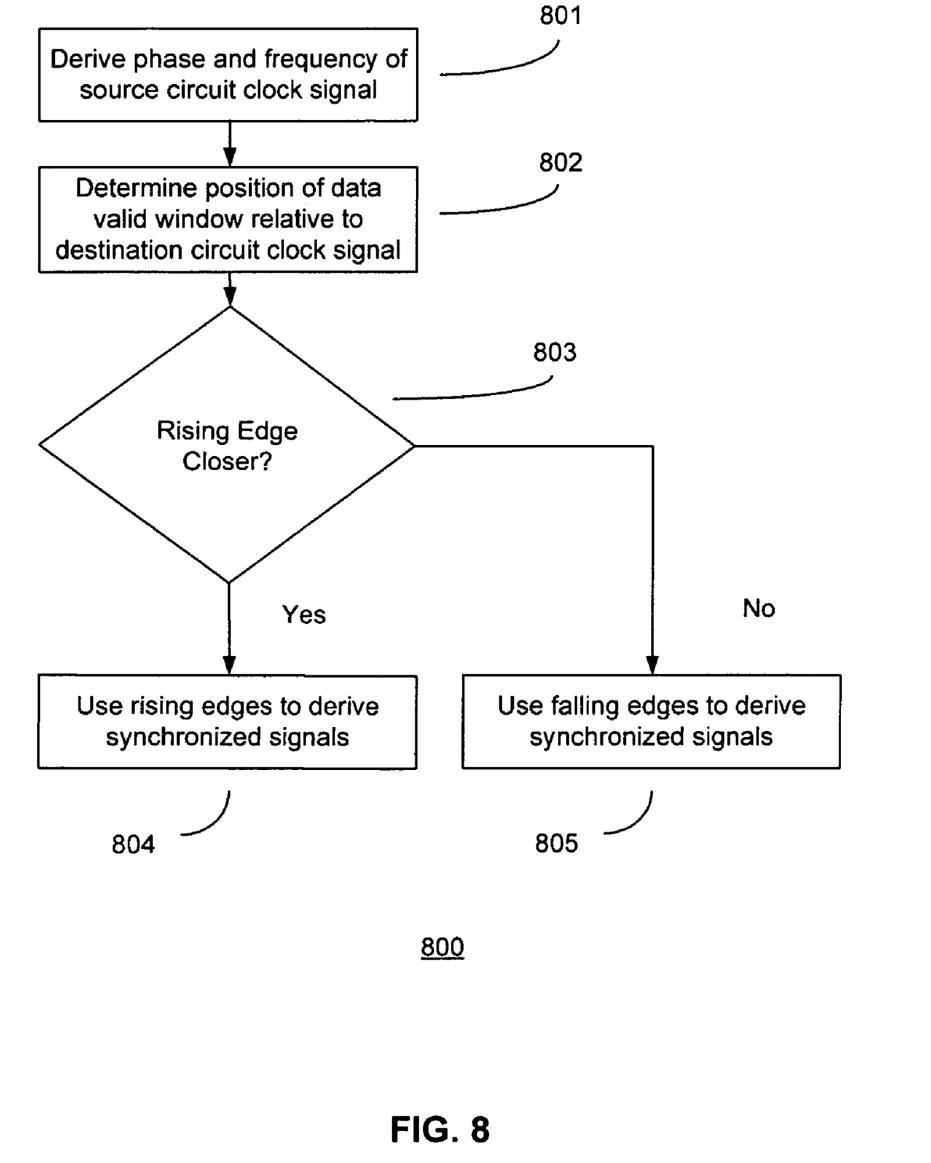
FIG. 8 is a flow diagram illustrating a method in accordance with an embodiment of the invention for selecting multiplexer settings for the multiplexers shown in FIG. 2.

FIG. 8 illustrates a flow diagram for a method 800 in accordance with aspects of an embodiment of the present invention. One or more elements of method 800 may be carried out, for example, by control sequencer 170 of FIG. 1, or other similar control element. Method 800 includes steps 801, 802, 803, 804, and 805. At step 801, a control element derives the phase and frequency of the source circuit clock signal. At step 802, the derived phase information is used to determine the position of a data valid window ("DVW") in relation to the destination circuit clock signal. At step 803, a decision is made as to whether the center of the DVW is closer to the rising or falling edges of the destination circuit clock signal. If it is closer to the rising edges, then, in step 804, these are used to generate synchronized half-data rate output signals. If it is closer to the falling edges, then, in step 805, these are used to generate synchronized half-data rate output signals.

An exemplary DVW can be illustrated with reference to FIG. 6. A DVW of width 2 t lies in the interval between $t_3$ and $t_5$. The center of the window lies at $t_4$ and is closest to rising edge 601 of clock signal CLK-1x. Hence, for the reasons explained above, muxes 13A-M, 13B-M, 13C-M and 13D-M will be set by control sequencer 170 to select their "0" inputs.

In the exemplary embodiment, the steps of method 800 are carried out by control sequencer 170. However, those skilled in the art will appreciate that the steps of method 800 may, in various exemplary embodiments be carried out in software used to configure a device that includes the illustrated read data path circuit, in dedicated hardware (which may, for example, be contained in control sequencer 170 of FIG. 1), or in a variety of combinations of on-chip and off-chip hardware and/or software elements.

Figure 9:
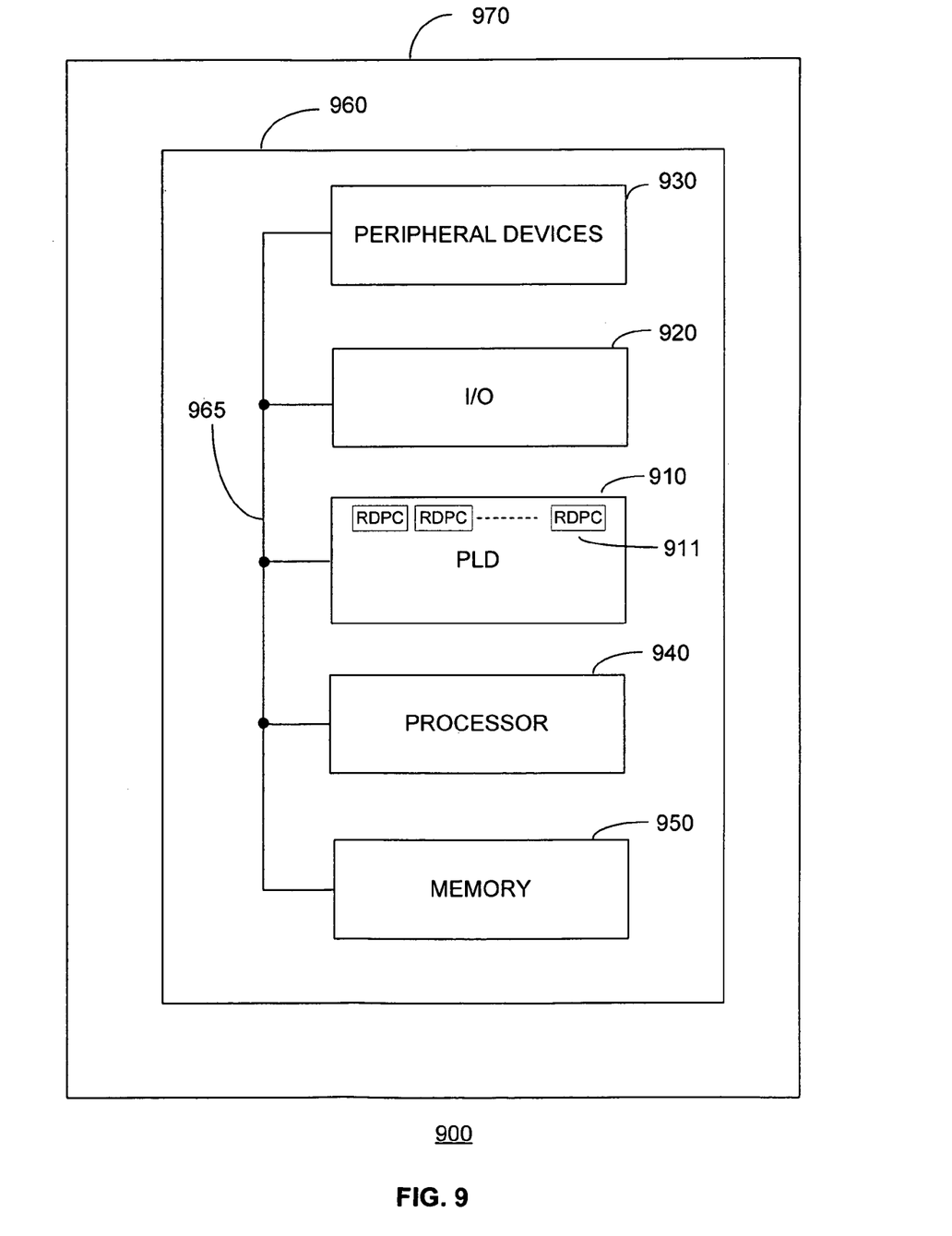
FIG. 9 illustrates a programmable logic device including a read data path circuit in accordance with an embodiment of the present invention implemented in a data processing system.

FIG. 9 illustrates a programmable logic device ("PLD") 910 including a read data path circuits 911 in accordance with an embodiment of the present invention. With reference to FIG. 1, those skilled in the art will appreciate that, in a particular example, components' such as capture circuit 110, de-multiplexing circuit 120, and synchronization circuit 130 may be replicated in each read data path circuit 911 shown in FIG. 9 while, at the same time, all the read data path circuits 911 may be controlled by a single PLL (such as PLL 160), toggle (such as toggle 150) and control sequencer (such as control sequencer 170).

PLDs (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names) are well known ICs that provide the advantages of fixed ICs with the flexibility of custom ICs. Such devices are well known in the art and typically provide an "off the shelf" device having at least a portion that can be programmed to meet a user's specific needs. Application specific ICs ("ASICs") have traditionally been fixed ICs, however, it is possible to provide an ASIC that has a portion or portions that are programmable; thus, it is possible for an IC device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table ("LUT") or product term, carry-out chain, register, and other elements. LABs (comprising multiple LEs) may be connected to horizontal and vertical lines that may or may not extend the length of the PLD.

PLDs have configuration elements that may be programmed or reprogrammed. Configuration elements may be realized as random access memory ("RAM") bits, flip-flops, electronically erasable programmable read-only memory ("EEPROM"), or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications.

FIG. 9 further illustrates PLD 910 implemented in a data processing system 900. Data processing system 900 may include one or more of the following components: a processor 940; memory 950; I/O circuitry 920; and peripheral devices 930. These components are coupled together by a system bus 965 and are populated on a circuit board 960 which is contained in an end-user system 970. A data processing system such as system 900 may include a single end-user system such as end-user system 970 or may include a plurality of systems working together as a data processing system.

System 900 can be used in a wide variety of applications, such as computer networking, data networking, instrumentation, video processing, digital signal processing, or any other application where the advantage of using programmable or reprogrammable logic in system design is desirable. PLD 910 can be used to perform a variety of different logic functions. For example, PLD 910 can be configured as a processor or controller that works in cooperation with processor 940 (or, in alternative embodiments, a PLD might itself act as the sole system processor). PLD 910 may also be used as an arbiter for arbitrating access to shared resources in system 900. In yet another example, PLD 910 can be configured as an interface between processor 940 and one of the other components in system 900. It should be noted that system 900 is only exemplary.

In one embodiment, system 900 is a digital system. As used herein a digital system is not intended to be limited to a purely digital system, but also encompasses hybrid systems that include both digital and analog subsystems.

Although particular embodiments have been described in detail and certain variants have been noted, various other modifications to the embodiments described herein may be made without departing from the spirit and scope of the present invention. Thus, the invention is limited only by the appended claims.

What is claimed is:

1. A read data path circuit comprising:
   a capture circuit coupled to receive a double-data rate signal and a capture clock signal and to generate single-data rate signals;
   a de-multiplexing circuit coupled to receive the single-data rate signals from the capture circuit and receive the capture clock signal and to generate half-data rate intermediate signals; and
   a synchronization circuit coupled to receive the half-data rate intermediate signals and a destination clock signal and to generate output signals synchronized to the destination clock signal.

2. The read data path circuit of claim 1 wherein a frequency of the capture clock signal is substantially equal to double a frequency of the destination clock signal.

3. The read data path circuit of claim 1 wherein the output signals include half-data rate signals.

4. The read data path circuit of claim 1 wherein:
   the de-multiplexing circuit comprises first and second de-multiplexing modules;
   the first de-multiplexing module is coupled to receive a first single-data rate signal and to generate first and second half-data rate intermediate signals; and
   the second de-multiplexing module is coupled to receive a second single-data rate signal and to generate third and fourth half-data rate intermediate signals.

5. The read data path circuit of claim 4 wherein:
   the synchronization circuit comprises first, second, third and fourth synchronizing modules;
   the first synchronizing module is coupled to receive the first half-data rate intermediate signal and to generate a first half-data rate synchronized signal;
   the second synchronizing module is coupled to receive the second half-data rate intermediate signal and to generate a second half-data rate synchronized signal;
   the third synchronizing module is coupled to receive the third half-data rate intermediate signal and to generate a third half-data rate synchronized signal; and
   the fourth synchronizing module is coupled to receive the fourth half-data rate intermediate signal and to generate fourth half-data rate synchronized signal.

6. The read data path circuit of claim 5 wherein:
   the first de-multiplexing module comprises a first flip-flop coupled to receive the first single-data rate signal and generate the first half-data rate intermediate signal and a second flip-flop coupled to a third flip-flop, the second flip-flop coupled to receive the first single-data rate signal and the third flip-flop coupled to generate the second half-data rate intermediate signal;
   the second de-multiplexing module comprises a first flip-flop coupled to receive the second single-data rate signal and generate the third half-data rate intermediate signal and a second flip-flop coupled to a third flip-flop, the second flip-flop coupled to receive the second single-data rate signal and the third flip-flop coupled to generate the fourth half-data rate intermediate signal;
   the first, second, and third flip-flops of the first and second de-multiplexing modules are coupled to be clocked by the full-rate capture clock signal; and
   the first flip-flops of the first and second de-multiplexing modules are coupled to be enabled when a toggle signal is high and the second flip-flops of the first and second de-multiplexing modules are coupled to be enabled when the toggle signal is low.

7. The read data path circuit of claim 6 wherein:
   each synchronizing module comprises a first positive edge triggered flip-flop coupled to a first input of a multiplexer and a series combination of a negative edge triggered flip-flop and a second positive edge triggered flip-flop coupled to a second input of the multiplexer;
   the first and second positive edge-triggered flip-flop and the negative edge-triggered flip-flop of each synchronizing module are coupled to be clocked by the destination clock signal; and
   each multiplexer is coupled to receive a multiplexer control signal.

8. The read data path circuit of claim 7 wherein the first input of each multiplexer is coupled to receive data captured on rising edges of the destination clock signal, and the second input of each multiplexer is coupled to receive data captured on falling edges of the destination clock signal.

9. The read data path circuit of claim 8 wherein the first, second, third, and fourth multiplexers are coupled to receive the multiplexer control signal from a control sequencer.

10. The read data path circuit of claim 9 wherein the control sequencer is coupled to determine a position of a data valid window in relation to the destination clock signal and to use that determination to provide a value of the multiplexer control signal.

11. The read data path circuit of claim 10 wherein the value of the multiplexer control signal is chosen to select an edge of the destination clock signal closest to a center of a data valid window of one or more the first, second, third, and fourth intermediate half-data rate signals.

12. The read data path circuit of claim 11 wherein:
if the center of the data valid window is closest to a rising edge of the destination clock signal, the value of the multiplexer control signal is chosen to select the first input of each multiplexer; and
if the center of the data valid window is closest to a falling edge of the destination clock signal, the multiplexer control signal is chosen to select the second input of each multiplexer.

13. The read data path circuit of claim 12 wherein the control sequencer is coupled to determine a relationship of the phase of the capture clock signal to the multiplexer setting.

14. The read data path circuit of claim 1 wherein the read data path circuit is coupled to control sequence means for determining a position of a data valid window of one or more of the half-data rate intermediate signals in relation to the destination clock signal.

15. The read data path circuit of claim 14 wherein the control sequence means is coupled to read a phase of the capture clock signal and determine whether a rising or falling edge of the destination clock signal is closer to a center of the data valid window.

16. A programmable logic device comprising the read data path circuit of claim 1.

17. A data processing system comprising the read data path circuit of claim 1.

18. A data processing system comprising the programmable logic device of claim 17.

19. A method of synchronizing a digital signal comprising:
receiving a double-data rate signal synchronized to a capture clock signal;
using the double-data rate signal to generate single-data rate signals synchronized to the capture clock signal;
using the single-data rate signals to generate half-data rate intermediate signals; and
using the half-data rate intermediate signals to generate output signals synchronized to a destination clock signal.

20. The method of claim 19 wherein a frequency of the capture clock signal is substantially equal to double a frequency of the destination clock signal.

21. The method of claim 19 wherein the output signals include half-data rate signals.

22. The method of claim 19 further comprising:
determining a position of a data valid window of one or more of the half-data rate intermediate signals relative to a phase of the destination clock signal.

23. The method of claim 22 further comprising:
selecting half-data rate intermediate signals captured on a rising edge of the destination clock signal if the rising edge is closer to a center of a data valid window than a falling edge of the destination clock signal; and
selecting half-data rate intermediate signals captured on a falling edge of the half-rate destination clock signal if the falling edge is closer to the center of the data valid window than the rising edge of the destination clock signal.

24. A read data circuit comprising:
capture means for using a double-data rate signal and a capture clock signal to generate single-data rate signals;
de-multiplexing means for using the single-data rate signals and the capture clock signal to generate half-data rate intermediate signals; and
synchronization means for using the half-data rate intermediate signals and a destination clock signal to generate output signals synchronized to the destination clock signal.

25. The read data circuit of claim 24 wherein a frequency of the capture clock signal is substantially equal to double a frequency of the destination clock signal.

26. The read data circuit of claim 24 further comprising:
means for determining a position of a data valid window of one or more of the half-data rate intermediate signals;
means for determining if a rising edge or a falling edge of the destination clock signal is closer to the center of the data valid window; and
means for selecting signals captured on either the rising or falling edges of the destination clock signal to generate the output signals synchronized to the destination clock signal wherein selecting depends upon whether the rising or falling edge of the destination clock signal is closer to the center of the data valid window.

* * * * *